(12) United States Patent
Kim

(10) Patent No.: US 9,966,485 B2
(45) Date of Patent: May 8, 2018

(54) SOLAR CELL AND METHOD OF FABRICATING THE SAME

(71) Applicant: LG INNOTEK CO., LTD., Seoul (KR)

(72) Inventor: Jong Hyun Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 542 days.

(21) Appl. No.: 14/361,250

(22) PCT Filed: Nov. 26, 2012

(86) PCT No.: PCT/KR2012/010048
§ 371 (c)(1),
(2) Date: May 28, 2014

(87) PCT Pub. No.: WO2013/081343
PCT Pub. Date: Jun. 6, 2013

(65) Prior Publication Data
US 2015/0114461 A1 Apr. 30, 2015

(30) Foreign Application Priority Data

Nov. 29, 2011 (KR) .......................... 10-2011-0126247

(51) Int. Cl.
*H01L 31/0224* (2006.01)
*H01L 31/0236* (2006.01)
(Continued)

(52) U.S. Cl.
CPC .... *H01L 31/02366* (2013.01); *H01L 31/0236* (2013.01); *H01L 31/022425* (2013.01);
(Continued)

(58) Field of Classification Search
CPC ....... H01L 31/022425; H01L 31/02366; H01L 31/0322; H01L 31/03923
(Continued)

(56) References Cited

U.S. PATENT DOCUMENTS

2001/0027803 A1* 10/2001 Sasaki ............. H01L 31/022425
136/249
2007/0001235 A1 1/2007 Rhodes
(Continued)

FOREIGN PATENT DOCUMENTS

| CN | 101253630 A | 8/2008 |
|---|---|---|
| JP | 2008-153714 A | 7/2008 |

(Continued)

OTHER PUBLICATIONS

International Search Report in International Application No. PCT/KR2012/010048, filed Nov. 26, 2012.
(Continued)

*Primary Examiner* — Allison Bourke
(74) *Attorney, Agent, or Firm* — Saliwanchik, Lloyd & Eisenschenk

(57) ABSTRACT

Disclosed are a solar cell and a method of fabricating the same. The solar cell includes a first back electrode layer on a support substrate; a second back electrode layer on the first back electrode layer; a light absorbing layer on the second back electrode layer; and a front electrode layer on the light absorbing layer.

8 Claims, 1 Drawing Sheet

(51) Int. Cl.
*H01L 31/18* (2006.01)
*H01L 31/032* (2006.01)
*H01L 31/0392* (2006.01)

(52) U.S. Cl.
CPC .... *H01L 31/0322* (2013.01); *H01L 31/03923* (2013.01); *H01L 31/18* (2013.01); *Y02E 10/541* (2013.01)

(58) Field of Classification Search
USPC ........................................................ 136/256
See application file for complete search history.

(56) References Cited

U.S. PATENT DOCUMENTS

| | | | | |
|---|---|---|---|---|
| 2008/0271781 | A1* | 11/2008 | Kushiya | H01L 31/0322 136/256 |
| 2008/0308147 | A1* | 12/2008 | Lu | H01L 31/022425 136/256 |
| 2010/0258163 | A1* | 10/2010 | Zheng | H01L 31/02366 136/252 |
| 2011/0146794 | A1* | 6/2011 | Tsai | H01L 31/02167 136/259 |

FOREIGN PATENT DOCUMENTS

| | | |
|---|---|---|
| KR | 10-2009-0123645 A | 12/2009 |
| KR | 10-2011-0047716 A | 5/2011 |
| KR | 10-2011-0068312 A | 6/2011 |
| KR | 10-2011-0077923 A | 7/2011 |

OTHER PUBLICATIONS

Office Action dated Mar. 25, 2013 in Korean Application No. 10-2011-0126247, filed Nov. 29, 2011.
Chinese Office Action filed Dec. 3, 2015 in Chinese Application No. 201280068451.8.
Xiong, Shaozhen et al., Solar Cell Foundation and Applications, Science Press, pp. 344-396.

* cited by examiner

[Fig. 1]
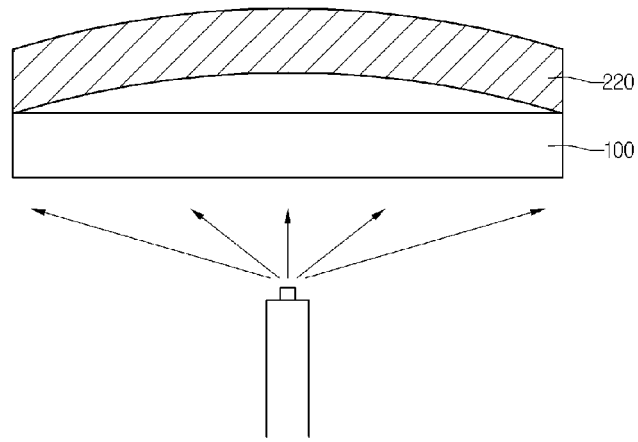
[Fig. 2]
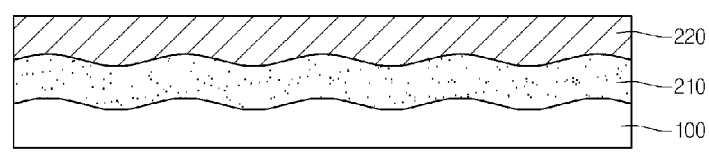
[Fig. 3]
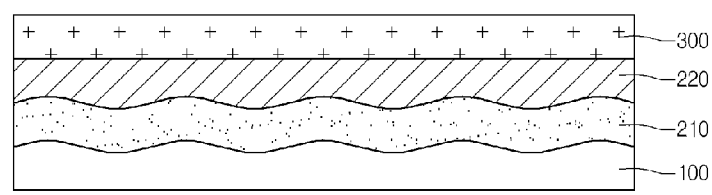
[Fig. 4]
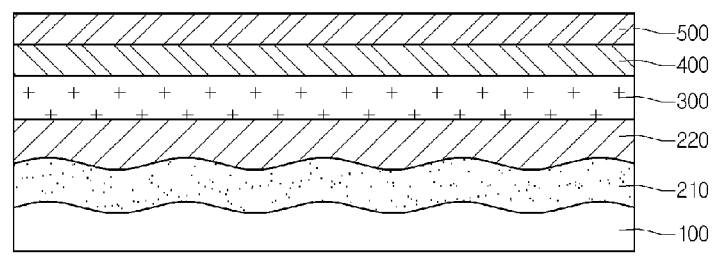
[Fig. 5]
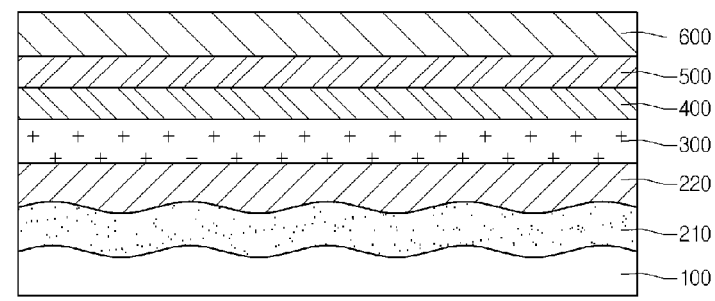

SOLAR CELL AND METHOD OF FABRICATING THE SAME

TECHNICAL FIELD

The embodiment relates to a solar cell and a method of fabricating the same.

BACKGROUND ART

Solar cells may be defined as devices to convert light energy into electrical energy by using a photovoltaic effect of generating electrons when light is incident onto a P-N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

A solar cell made from CIGS (CuInGaSe), which is one of group I-III-VI Chal-copyrite-based compound semiconductors, represents superior light absorption, higher photo-electric conversion efficiency with a thin thickness, and superior electro-optic stability, so the CIGS solar cell is spotlighted as a substitute for a conventional silicon solar cell.

In general, a CIGS solar cell can be prepared by sequentially forming a back electrode layer, a light absorbing layer and a front electrode layer on a substrate including sodium. Since molybdenum (Mo) has a thermal expansion coefficient similar to that of an organic substrate with a low specific resistance, the molybdenum (Mo) is mainly used for the back electrode layer and the molybdenum (Mo) is deposited on the substrate through a DC sputtering process.

In the sputtering process for depositing the back electrode layer, if sputtering power is increased, tack time may be reduced, but the grain size is increased. Thus, compressive force may occur between grains, so the back electrode layer may be separated from the substrate. Meanwhile, if the sputtering power is reduced, the grain size is slightly reduced so the adhesive strength between the back electrode layer and the substrate may be enhanced, but the tack time may be increased.

DISCLOSURE OF INVENTION

Technical Problem

The embodiment provides a solar cell capable of improving adhesive strength between a support substrate and a back electrode layer and a method of fabricating the same.

Solution to Problem

According to the embodiment, there is provided a solar cell including a first back electrode layer on a support substrate; a second back electrode layer on the first back electrode layer; a light absorbing layer on the second back electrode layer; and a front electrode layer on the light absorbing layer.

According to the embodiment, there is provided a method of fabricating a solar cell, the method including forming a second back electrode layer on a support substrate; forming a first back electrode layer between the support substrate and the second back electrode layer; forming a light absorbing layer on the second back electrode layer; and forming a front electrode layer on the light absorbing layer.

Advantageous Effects of Invention

According to the solar cell of the embodiment, the first back electrode layer is formed between the support substrate and the second back electrode layer, so that adhesive strength between the support substrate and the second back electrode layer can be improved.

According to the method of fabricating the solar cell of the embodiment, the second back electrode layer is deposited by increasing the sputtering power, so the tack time can be reduced and the deposition rate can be improved.

BRIEF DESCRIPTION OF DRAWINGS

FIGS. 1 to 5 are sectional views showing a method of fabricating a solar cell according to the embodiment.

MODE FOR THE INVENTION

In the description of the embodiments, it will be understood that, when a substrate, a layer, a film, or an electrode is referred to as being "on" or "under" another substrate, another layer, another film, or another electrode, it can be "directly" or "indirectly" on the other substrate, the other layer, the other film, or the other electrode, or one or more intervening layers may also be present. Such a position of each component has been described with reference to the drawings. The thickness and size of each component shown in the drawings may be exaggerated, omitted or schematically drawn for the purpose of convenience or clarity. In addition, the size of elements does not utterly reflect an actual size.

FIGS. 1 to 5 are sectional views showing a method of fabricating a solar cell according to the embodiment. Hereinafter, the solar cell and the method of fabricating the same according to the embodiment will be described in detail with reference to FIGS. 1 to 5.

Referring to FIG. 1, a second back electrode layer 220 is formed on a support substrate 100. The support substrate 100 has a plate shape and supports a first back electrode layer 210, the second back electrode layer 220, a light absorbing layer 300, a buffer layer 400, a high resistance buffer layer 500 and a front electrode layer 600.

The support substrate 100 may be an insulator. For example, the support substrate 100 may be a glass substrate, a plastic substrate or a metal substrate. In detail, the support substrate 100 may be a soda lime glass substrate. In addition, the support substrate 100 may be transparent. In detail, the support substrate 100 may be rigid or flexible.

The second back electrode layer 220 is disposed on the support substrate 100. The second back electrode layer 220 may include at least one of molybdenum (Mo), gold (Au), aluminum (Al), chrome (Cr), tungsten (W), and copper (Cu). In detail, the second back electrode layer 200 may be formed of the Mo. In addition, the second back electrode layer 220 may be a crystalline electrode layer including crystalloid of the above described materials.

The second back electrode layer 220 may be formed through PVD (physical vapor deposition) or plating. In detail, the second back electrode layer 220 may be formed through the DC sputtering process. In general, if sputtering power is increased in the DC sputtering process, tack time may be reduced, but the grain size is increased. Thus, compressive force may occur between grains, so the back electrode layer may be separated from the substrate. Meanwhile, if the sputtering power is reduced, the grain size is slightly reduced so the adhesive strength between the back electrode layer and the substrate may be enhanced, but the tack time may be increased.

In order to solve the above problem, according to the method of fabricating the solar cell of the embodiment, the laser irradiation process is additionally performed with high power after the second back electrode layer 220 has been formed on the support substrate 100, so that the adhesive strength between the support substrate 100 and the second back electrode layer 220 can be enhanced.

In more detail, as shown in FIG. 1, the laser irradiation process may be performed by uniformly irradiating laser beam to the bottom surface of the support substrate 100. The laser beam used in the laser irradiation process may not be specially limited if it can melt at least one of the support substrate 100 and the second back electrode layer 220.

In addition, the wavelength of the laser beam may not be specially limited if it may allow the laser beam to transmit through the support substrate 100. For instance, the laser beam may have the wavelength in the range of about 400 nm to about 1200 nm, but the embodiment is not limited thereto. In addition, the laser beam has pulses repeated according to high repetition rate to melt at least one of the support substrate 100 and the second back electrode layer 220. For instance, the repetition rate may be maintained in the range of about 10 kHz to 30 kHz. In addition, the laser beam preferably has the slow scan rate to exert the influence of the laser beam for a long period of time. For instance, the scan rate of the laser beam may be maintained in the range of about 1 mm/s to about 10 mm/s. The sputtering power can be adjusted in the range of about 100 mJ/cm$^2$ to about 500 mJ/cm$^2$. If the sputtering power is less than about 100 mJ/cm$^2$, the support substrate 100 or the second back electrode layer 220 may not be sufficiently melted. In addition, if the sputtering power exceeds 500 mJ/cm$^2$, the second back electrode layer 220 may be delaminated from the support substrate 100.

At least one of the support substrate 100 and the second back electrode layer 220 may be melted through the laser irradiation process. That is, the support substrate 100 may not be melted and the second back electrode layer 220 may be melted. Otherwise, the support substrate 100 may be melted and the second back electrode layer 220 may not be melted. In addition, both of the support substrate 100 and the second back electrode layer 220 may be melted. At this time, at least one of the support substrate 100 and the second back electrode layer 220 may be melted at the boundary between the support substrate 100 and the second back electrode layer 220. For instance, the laser beam may melt at least one of a top surface of the support substrate 100 and a bottom surface of the second back electrode layer 220.

Referring to FIG. 2, the support substrate 100 and the second back electrode layer 220 are coagulated at the boundary between the support substrate 100 and the second back electrode layer 220 to form the first back electrode layer 210. That is, the support substrate 100 may be melted and coagulated with the second back electrode layer 220 to form the first back electrode layer 210. Otherwise, the second back electrode layer 220 may be melted and coagulated with the support substrate 100 to form the first back electrode layer 210. In addition, both of the support substrate 100 and the second back electrode layer 220 may melted and coagulated with each other to form the first back electrode layer 210. At this time, at least one of the top surface of the support substrate 100 and the bottom surface of the second back electrode layer 220 may be melted and coagulated with each other. The first back electrode layer 210 may have a thickness in the range of about 50 nm to about 150 nm, but the embodiment is not limited thereto.

The first back electrode layer 210 may include a material equal to a material of the second back electrode layer 220. That is, since the first back electrode layer 210 is formed by melting the second back electrode layer 220, the first back electrode layer 210 may include a first constituent constituting the second back electrode layer 220. For instance, the first constituent may include at least one of molybdenum (Mo), gold (Au), aluminum (Al), chrome (Cr), tungsten (W), and copper (Cu). In more detail, the first constituent may be the Mo.

In addition, if the support substrate 100 is melted in the laser beam irradiation process, the first back electrode layer 210 may further include a second constituent constituting the support substrate 100. For instance, if the support substrate 100 is prepared as a glass substrate, the first back electrode layer 210 may include Si component.

Different from the second back electrode layer 220, the first back electrode layer 210 may be an amorphous electrode layer. That is, the back electrode layer of the solar cell according to the embodiment may be a composite electrode layer including both of the amorphous first back electrode layer 210 and the crystalline second back electrode layer 220.

As described above, according to the solar cell of the embodiment, the first back electrode layer 210 is formed between the support substrate 100 and the second back electrode layer 220, so the adhesive strength between the support substrate 100 and the second back electrode layer 220 can be improved. In addition, due to the first back electrode layer 210, the sputtering process can be performed with high power when the second back electrode layer 220 is deposited, so the tack time can be shortened and the deposition rate can be enhanced.

Referring to FIG. 3, the light absorbing layer 300 is provided on the second back electrode layer 230. The light absorbing layer 300 includes a group I-III-VI compound. For example, the light absorbing layer 300 may have the CIGSS (Cu(IN,Ga)(Se,S)$_2$) crystal structure, the CISS (Cu (IN)(Se,S)$_2$) crystal structure or the CGSS (Cu(Ga)(Se,S)$_2$) crystal structure.

For instance, the light absorbing layer 300 may be formed through various schemes such as a scheme of forming a Cu(In,Ga)Se$_2$ (CIGS) based light absorbing layer 300 by simultaneously or separately evaporating Cu, In, Ga, and Se and a scheme of performing a selenization process after a metal precursor layer has been formed.

Regarding the details of the selenization process after the formation of the metal precursor layer, the metal precursor layer is formed on the back electrode layer 200 through a sputtering process employing a Cu target, an In target and a Ga target. Then, the metal precursor layer is subject to the selenization process so that the Cu(In, Ga) Se$_2$ (CIGS) based light absorbing layer 300 is formed.

In addition, the sputtering process employing the Cu target, the In target, and the Ga target and the selenization process may be simultaneously performed.

Further, a CIS or a CIG based light absorbing layer 300 may be formed through the sputtering process employing only Cu and In targets or only Cu and Ga targets and the selenization process.

Referring to FIG. 4, the buffer layer 400 and the high-resistance buffer layer 500 are sequentially formed on the light absorbing layer 300.

The buffer layer 400 may include CdS, ZnS, In$_X$S$_Y$ or In$_X$Se$_Y$Zn(O,OH). The buffer layer 400 may be formed by depositing the CdS on the light absorbing layer 300 through a CBD (Chemical Bath Deposition) scheme. The high-resistance buffer layer 500 is formed by depositing zinc oxide on the buffer layer 400 through the sputtering process. For instance, the high-resistance buffer layer 500 includes i-ZnO, which is not doped with impurities.

Referring to FIG. 5, the front electrode layer 600 is formed on the high-resistance buffer layer 500. The front electrode layer 600 may be formed of a transparent conductive material. In addition, the front electrode layer 600 may have characteristics of an N type semiconductor. The front electrode layer 600 forms an N type semi-conductor layer together with the buffer layer 400 to form the PN junction in corporation with the light absorbing layer 300 serving as a P type semiconductor layer. For instance, the front electrode layer 700 may include aluminum doped zinc oxide (AZO).

The front electrode layer 600 can be formed by laminating a transparent conductive material on the high-resistance buffer layer 500. The transparent conductive material may include zinc oxide doped with aluminum or boron. For instance, the front electrode layer 600 can be formed through the sputtering or chemical vapor deposition. In more detail, in order to form the front electrode layer 600 through the sputtering, an RF sputtering process may be performed by using a ZnO target or a reactive sputtering process may be performed by using a Zn target.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
a support substrate comprising a first surface and a second surface opposite to the first surface;
a first back electrode layer disposed on the second surface of the support substrate and comprising a first surface and a second surface opposite to the first surface;
a second back electrode layer disposed on the second surface of the first back electrode layer and comprising a first surface and a second surface opposite to the first surface;
a light absorbing layer disposed on the second surface of the second back electrode layer, and
a front electrode layer on the light absorbing layer,
wherein a roughness of the first surface of the support substrate is different from a roughness of the second surface of the support substrate,
wherein a roughness of the first surface of the second back electrode layer is different from a roughness of the second surface of second back electrode layer,
wherein the second surface of the support substrate comprises a plurality of curved shapes,
wherein the first surface of the support substrate comprises a planar shape,
wherein the first surface of the second back electrode layer comprises a plurality of curved shapes,
wherein the second surface of the second back electrode comprises a planar shape,
wherein the first surface of the first back electrode layer comprises a plurality of curved shapes,
wherein the second surface of the first back electrode comprises a plurality of curved shapes,
wherein the support substrate comprises a transparent glass substrate comprising a silicon (Si) component,
wherein the second back electrode layer comprises molybdenum (Mo),
wherein the first back electrode layer includes molybdenum (Mo) and silicon (Si), and
wherein a molybdenum (Mo) content of the second back electrode layer is greater than a molybdenum (Mo) content of the first back electrode layer.

2. The solar cell of claim 1, wherein the first back electrode layer includes an amorphous electrode layer and the second back electrode layer includes a crystalline electrode layer.

3. The solar cell of claim 1, wherein the first back electrode layer is formed by melting the support substrate at a boundary between the support substrate and the second back electrode layer.

4. The solar cell of claim 1, wherein the first back electrode layer has a thickness in a range of 50 nm to 150 nm.

5. The solar cell of claim 1, wherein the first back electrode layer is formed by melting the second back electrode layer at a boundary between the support substrate and the second back electrode layer.

6. The solar cell of claim 1, wherein the first back electrode layer is formed by melting both of the support substrate and the second back electrode layer at a boundary between the support substrate and the second back electrode layer.

7. The solar cell of claim 1, wherein the support substrate and the first back electrode layer have complementary shapes at a boundary between the support substrate and the first back electrode layer.

8. The solar cell of claim 1, wherein a crystallinity of the first back electrode layer is different from a crystallinity of the second back electrode layer.

* * * * *